United States Patent [19]

Ishikawa et al.

[11] Patent Number: 5,440,504
[45] Date of Patent: Aug. 8, 1995

[54] ARITHMETIC APPARATUS FOR DIGITAL SIGNAL PROCESSOR

[75] Inventors: Toshihiro Ishikawa, Yokohama; Katsuhiko Ueda, Sakai; Mikio Sakakihara, Otsu, all of Japan

[73] Assignee: Matsushita Electric Industrial Co., Ltd., Osaka, Japan

[21] Appl. No.: 198,640

[22] Filed: Feb. 18, 1994

[30] Foreign Application Priority Data

Feb. 19, 1993 [JP] Japan .................. 5-030419

[51] Int. Cl.[6] ............... G06F 7/38; G06F 7/50
[52] U.S. Cl. .................. 364/736; 364/749; 364/784
[58] Field of Search ........... 364/736, 745, 748, 778, 364/781, 784, 715.04, 715.1, 749

[56] References Cited

U.S. PATENT DOCUMENTS 4,677,582  6/1987  Nagafuji .................. 364/736
4,789,956 12/1988  Hildebrandt .......... 364/736.5

FOREIGN PATENT DOCUMENTS 63-152229  6/1988  Japan .

Primary Examiner—Roy N. Envall, Jr.
Assistant Examiner—Emmanuel L. Moise
Attorney, Agent, or Firm—Spencer, Frank & Schneider

[57] ABSTRACT

In a digital signal processor, an arithmetic apparatus capable of performing Viterbi decoding processing at a high speed with minimum addition of hardware and least overhead of memory. Pathmetric value and branchmetric value read out from first and second memories on two paths are simultaneously added by an adder at most significant bits and least significant bits thereof. A comparator compares values of the most significant bits and the least significant bits output from the adder to generate a path select signal indicating the value which is pathmetrically smaller. The select signal is stored in a shift register on a bit-by-bit basis. Of the values of the most significant bits and the least significant bits of a register storing the output of the adder, the smaller one as decided by the path select signal is written in the memory at eight most significant bits or least significant bits thereof via distributor, a bus and a register.

5 Claims, 3 Drawing Sheets

ARITHMETIC APPARATUS FOR DIGITAL SIGNAL PROCESSOR

BACKGROUND OF THE INVENTION

1. Field of the Invention

The present invention relates to an arithmetic apparatus adapted for incorporation in a digital signal processor for performing Viterbi decoding of convolutional codes for error correction.

2. Description of the Related Art

In recent years, the digital signal processor (hereinafter also referred to as DSP in abbreviation) has attracted attention as a processor applicable to portable telephones and the like accompanying an increasing trend of adopting of digital systems in the field of mobile communication services. In a DSP for a speech encoding device for a mobile digital communication system mentioned above, out error correction processing is required in addition to operations such as speech encoding processing. As the error correction procedure, Viterbi decoding maybe adopted.

The Viterbi algorithm is the maximal likelihood decoding of convolutional codes through repetition of simple arithmetic processings such as addition, comparison and selection. In Viterbi decoding, every time the data to be decoded (received data) corresponding to one information bit is obtained, a cumulative number of paths remaining alive (hereinafter also referred to as the pathmetric) in the individual states at that time point is calculated and updated.

Figure 2:
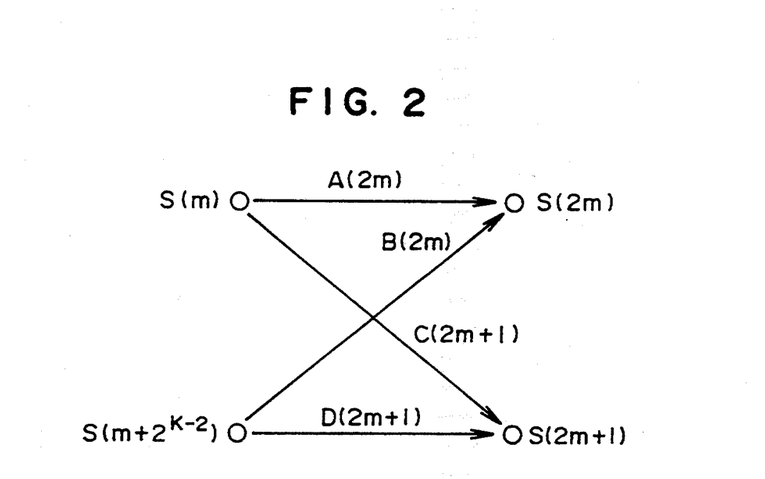
FIG. 2 is a diagram for illustrating state transition paths of convolutional coder in Viterbi decoding.

FIG. 2 illustrates a state transition in a convolutional encoder of a constraint length K (where $K \geq 2$) in which two paths indicating state transitions, respectively, extend to a state $S(2m)$ (where $m=0, 1, 2, 3, \ldots, 2^{K-2}-1$) and a state $S(2m+1)$ from each of the immediately preceding states $S(m)$ and $S(m+2^{K-2})$ at a given time point. In the figure, $A(2m)$ and $B(2m)$ represent output symbols of the paths reaching the state $S(2m)$ and the Hamming distance from the received data (hereinafter referred to as the branchmetrics). Similarly, $C(2m+1)$ and $D(2m+1)$ represent the branchmetrics of the paths reaching the state $S(2m+1)$. In selection of the path, a table containing previously calculated branchmetrics previously is first referred to adding the branchmetrics mentioned above to the pathmetric values of the individual live paths alive at the immediately preceding time point for arithmetically determining a total sum metric for each path. Subsequently, the pathmetrics of the two paths reaching the state $S(2m)$ are compared, whereby the path having a smaller sum of the Hamming distances is selected with the other being discarded. As is now apparent, in the decoding of the convolutional code according to the Viterbi algorithm, that is, the addition, comparison and selection arithmetics and the storage of the pathmetric (more specifically, the additions of the branchmetric to the pathmetrics for the input up to the immediately preceding time point, comparison of the results of additions, and selection of the optimal path) are performed for $2^{K-1}$ states at a series of sequential time points.

For a better understanding of the invention, a typical arithmetic apparatus known heretofore will be described by reference to a schematic diagram shown in FIG. 1 of the accompany drawings.

Figure 1:
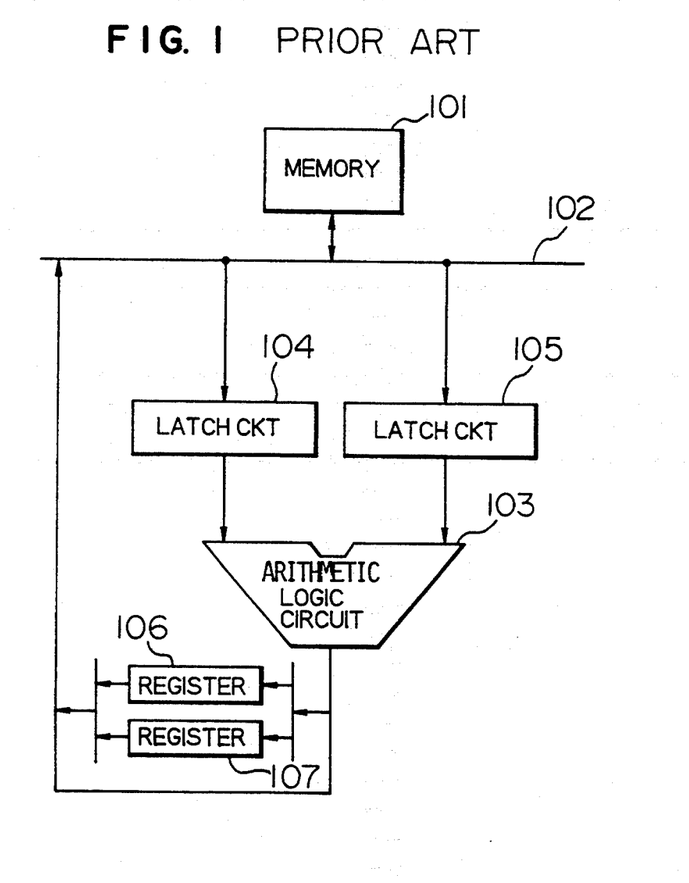
FIG. 1 is a schematic diagram showing a configuration of an arithmetic unit known heretofore.

In FIG. 1, a reference numeral 101 denotes a memory which stores therein instruction words for a processor, pathmetrics (cumulative amounts) of the paths in the individual states of the Viterbi decoding, a table of branchmetric values which the individual paths assume for the value of the coded data (received data) corresponding to one-bit of information, and the results of selections of the live paths (i.e., paths remaining alive) in each of the states and others. Further, reference numeral 102 denotes a data bus connected to the memory 101 used for data transfer and storing results of arithmetic operations. Reference numeral 103 denotes an arithmetic logic circuit for performing arithmetic logic operations. Reference numerals 104 and 105 denote latch circuits for temporarily storing a right input value and a left input value, respectively, for the arithmetic logic circuit 103. Numerals 106 and 107 denote registers each serving for temporarily storing the result of an operation.

In the arithmetic apparatus having the structure implemented as described above, operations for updating the pathmetric in the state $S(2m)$ shown in FIG. 2 and operation for storing the path select signal through the addition, comparison and selection processes in the Viterbi decoding for one received bit of data will be elucidated below by classifying the processing into six steps (1) to (6).

(1) First addition step of pathmetric and branchmetric

The pathmetric value in the state $S(m)$ shown in FIG. 2 is stored in the latch circuit 104 from the memory 101 via the bus 102, while the value of branchmetric $A(2m)$ is similarly stored in the latch circuit 105 from the memory 101 via the bus 102. The arithmetic logic circuit 103 performs addition of the contents of the latch circuits 104 and 105, the result of which is stored in the register 106.

(2) Second addition step of pathmetric and branchmetric

The value of pathmetric in the state $S(m+2^{K-2})$ shown in FIG. 2 is stored in the latch circuit 104 from the memory 101 via the bus 102, while the value of the branchmetric $B(2m)$ is stored in the latch circuit 105 from the memory 101 via the bus 102. The arithmetic logic circuit 103 adds the contents of the latch circuits 104 and 105, the result of which is stored in the register 107.

(3) Subtraction (comparison) step of results of the two addition steps

The contents of the registers 106 and 107 are transferred to the latch circuits 104 and 105, respectively. The arithmetic logic circuit 103 performs subtraction between the contents of the latch circuits 104 and 105. However, the result of this subtraction is not stored.

(4) Sign decision (selection) step of results of the substraction

A controller (not shown) determines the sign of the result of the substraction performed in the step (3) to thereby effect a program control (branching) in a step (5) or (6) mentioned below.

(5) Step of storing the addition result decided as being smaller (updating of the pathmetric)

When the decision step 4) shows that the result of the subtraction in the step (3) is minus, that is, negative, the content of the register 106 is stored in memory 101. Otherwise, the content of the register 107 is stored in memory 101.

(6) Step of storing a path select signal

When the decision step (4) shows that the result of the subtraction step (3) is minus or negative, a value of "0" is stored in the memory 101. Otherwise, a value of "1" is stored in the memory 101.

By repeating the six steps (1) to (6) mentioned above $2^{K-1}$ times, the pathmetrics for all the states are updated.

As is now apparent from the above, in the arithmetic apparatus known heretofore, the Viterbi decoding processing can be realized through the addition and the comparison performed by the arithmetic logic circuit 103 and by controlling the programs in dependence on the result of the comparison.

The arithmetic apparatus known heretofore suffers from problems in that a large number of operation steps are involved for a single routine of the addition, comparison and the selection arithmetics and that a large memory capacity is required because the single-bit path select signal is stored in one word of the memory.

SUMMARY OF THE INVENTION

In the light of the state of the art, it is an object of the present invention to solve the problems of the prior art and provide an arithmetic apparatus which is capable of realizing Viterbi decoding with a reduced number of operation steps and with a smaller memory capacity.

In view of the above and other objects which will become apparent as description proceeds, there is provided according to a first aspect of the invention an arithmetic apparatus which includes first and second memories each for storing data of 2n-bit width (where n is a positive integer), an adder for adding together the data stored in the first and second memories, a register for temporarily storing the output of the adder, a comparator for comparing a value of n most significant bits and n least significant bits outputted from the adder for thereby outputting a select control signal indicating which of the n most significant bits or the n least significant bits is of a smaller value, a shift register for storing the select control signal as input thereto, and a write module for writing the value of either the n most significant bits or the n least significant which is decided to be smaller by the comparator in the first memory at n most significant bits thereof or at n least significant bits.

Further, there is provided according to a second aspect of the invention an arithmetic apparatus which further includes storage for temporarily storing data read out from the first memory and outputting the data to the adder.

Furthermore, according to a third aspect of the invention, there is provided an arithmetic apparatus which includes an arithmetic section for performing arithmetic operations on the data read out from the first and second memories, a write means for writing an output of the arithmetic section in the first memory, a priority encoder for detecting a number of left-shifts required for normalization of the output of the arithmetic section, a first multiplexer for selecting one of the output of the priority encoder or n least significant bits of the output of the adder for outputting the selected one to the comparator, a selector for selecting in accordance with the select signal one of the output of the priority encoder or an output of a third register which stores the output of the selector, a second multiplexer for selecting one of the output of the third register or n most significant bits of the output of the adder to thereby supply the selected one to the comparator, and a barrel shifter for shifting the data read out from the first memory in accordance with a number of shifts outputted from the third register.

With the arithmetic apparatus according to the first aspect of the present invention, addition of the n most significant bits and addition of the n least significant bits of the data stored in the first and second memories, respectively, are simultaneously effected by the adder, while the comparator compares the value of the n most significant bits and that of the n least significant bits as outputted from the adder to thereby write the result of the addition for the n most significant bits or n least significant bits which is decided to be a smaller value by the comparator in either the n most significant bits or n least significant bits of the first memory by the write unit, to thereby allow the shift register to sequentially store the select control signals outputted from the shift register. Thus, it is possible to perform the addition, comparison and the selecting arithmetic for the cumulative value of the live paths in the Viterbi decoding, as well as the storage of the path select signal with a decreased number of processing steps and a small memory overhead.

With the arithmetic apparatus according to the second aspect of the invention, the data read out from the first memory is temporarily stored in the storage and at the same time outputted to the adder for allowing the adder to perform the first addition, while the second addition is performed on the data which has been stored in the storage as the result of the first addition, it is possible to decrease the number of times a memory access is required, which in turn means that the Viterbi decoding can be carried out with a reduced number of processing steps.

In the arithmetic apparatus according to the third aspect of the invention, upon storage of the output of the arithmetic section in the first memory, the priority encoder detects the number of left-shifts which is required for normalizing the results of operation performed by the arithmetic section and outputs the left-shift number detected to the comparator which then compares the output of the priority encoder with the output of the third register, with the result of the comparison being transferred to the selector. The selector selects the smaller value of the output of the priority encoder or the output of the third register, and stores the selected value in the third register. Thus, it is possible to determine the minimum left-shift number required for standardizing a series of results of operations performed by the arithmetic section simultaneously with the storage of the results of these operations outputted successively from the arithmetic section, whereby the block floating-point arithmetic processing can be carried out at a high speed.

DESCRIPTION OF THE PREFERRED EMBODIMENTS

Now, the present invention will be described in detail in conjunction with preferred or exemplary embodiments thereof by reference to the drawings.

Figure 3:
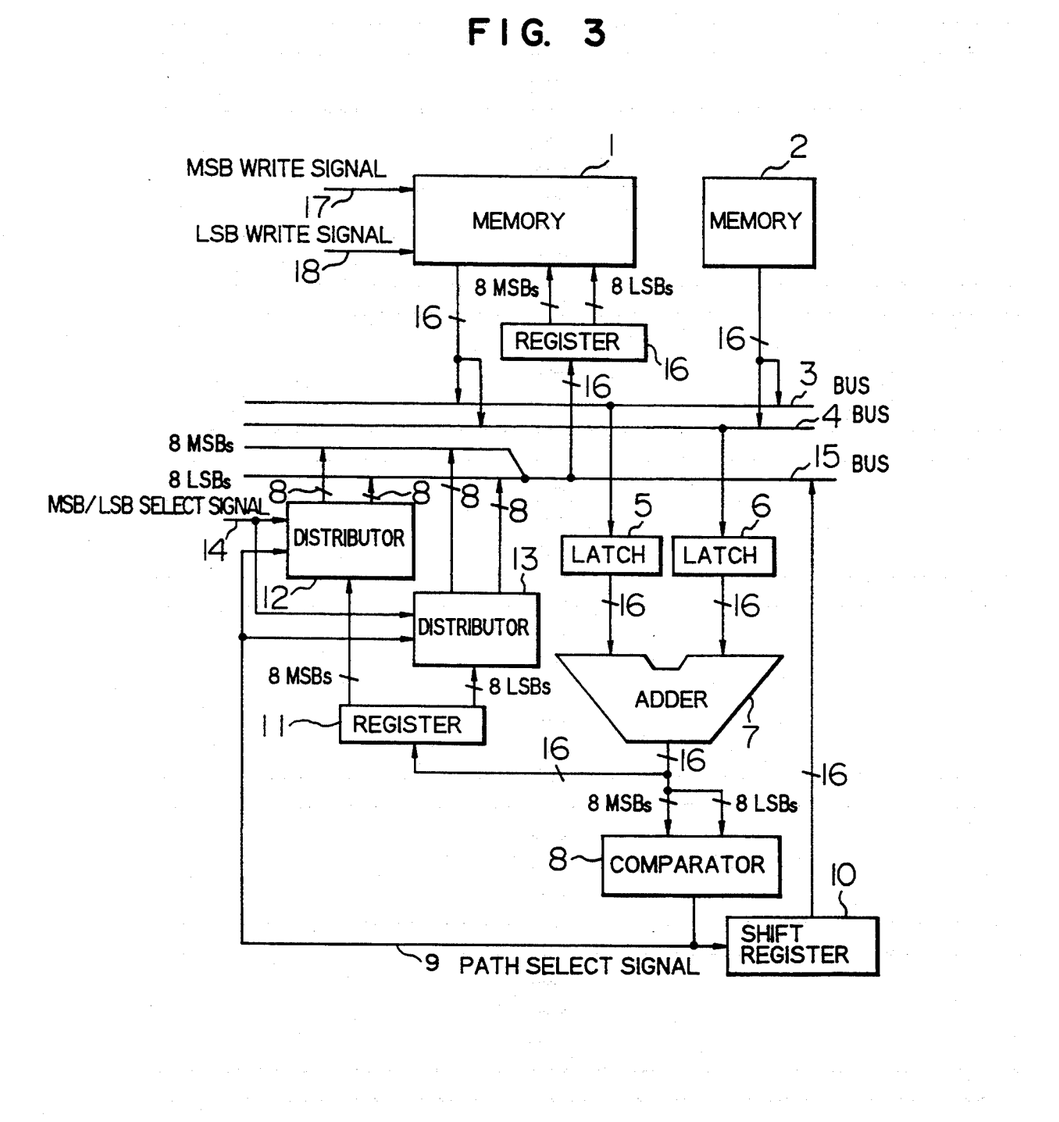
FIG. 3 is a schematic block diagram showing a configuration of an arithmetic apparatus according to a first embodiment of the invention.

FIG. 3 shows a schematic block diagram of an arithmetic apparatus according to a first embodiment of the invention.

In FIG. 3, reference numeral 1 denotes a memory of 16-bit width for storing a cumulative amount of live paths remaining alive in each of the states in the Viterbi decoding (also referred to as the pathmetric value or simply as the pathmetric), as well as the result of selections of the live paths in each of the state (the signal indicating this result of selection is referred to as the path select signal). Reference numeral 2 denotes a memory of 16-bit width for previously storing a table of branchmetric values assumed by the paths for coded data (received data series) corresponding to one information bit. Numeral 3 denotes a 16-bit bus connected to memories 1 and 2 for supplying data to the lefthand input of an adder 7 mentioned below. Numeral 4 denotes a 16-bit bus connected to memories 1 and 2 for supplying data to the righthand input of the adder 7. Numeral 5 denotes a latch circuit for temporarily storing the content of bus 3, which is applied to the lefthand input of the adder 7, and numeral 6 denotes a latch circuit for temporarily storing the content of a bus 4 which is applied to the righthand input of the adder 7. Now, the adder 7 is implemented in the form of a 16-bit adder for adding together the outputs of latch circuits 5 and 6. Further, reference numeral 8 denotes a comparator for comparing values given by the eight most significant bits (or MSBs in abbreviation) and the eight least significant bits (or LSBs in abbreviation) both output from the adder 7 to thereby generate a path select signal 9 which assumes a value "0" when the value of the eight MSBs is less than that of the eight LSBs, while assuming a value "1" when the value of the eight LSBs is less than that of the eight MSBs. Numeral 10 denotes a 16-bit shift register receiving as input data the path select signal 9 for outputting the path select signal 9 to a bus 15 mentioned below. Numeral 11 denotes a register for storing the output of the adder 7. Numeral 12 denotes a distributor which operates in response to the path select signal 9 of "0" to thereby output the value of the eight MSBs placed in register 11 to eight MSB lines of a bus 15 mentioned below when the value of a MSB/LSB select signal 14 output from a controller (not shown) is "1", while outputting the contents of register 11 to eight LSB lines of the bus 15 when the MSB/LSB select signal 14 is "0". Numeral 13 denotes a distributor which operates in response to the path select signal 9 having the value "1" to thereby output the value of the eight MSBs placed in the register 11 to eight MSB lines of the bus 15 when the value of the MSB/LSB select signal 14 output from the controller (not shown) is "1", while outputting the contents of register 11 to the eight LSB lines of the bus 15 when the MSB/LSB select signal 14 is "0". Numeral 15 denotes a bus of 16-bit width connected to the distributors 12 and 13 and shift register 10 for supplying data to a register 16 which serves to temporarily store the value on the bus 15 for outputting the value on the bus to the memory 1. Numeral 17 designates a MSB write signal which is output from the controller (not shown) and commands writing of the value of the eight MSBs stored in register 16 in the memory 1 at eight MSBs thereof. Numeral 18 denotes a LSB write signal which is output from the controller (not shown) and commands writing of the value of the eight LSBs of register 16 in the memory 1 at eight LSBs thereof.

Now, description will turn to operation of the arithmetic apparatus of the structure described above by reference to FIGS. 2 and 3 along with Tables 1 and 2.

Table 1 shows a memory map of memory 1 when pathmetric values in the individual states at given points are stored in memory 1. In this table, a symbol M(m) represents a pathmetric value of the live paths in the state S(m) at a given time point. Further, symbol K represents a constraint length of a convolutional code to be decoded. A symbol M'(2m) at an address (t'+2m) represents the pathmetric value for the live paths in the state S(2m) at a succeeding time point which has been updated through addition, comparison and selection processing performed on the values of M(m) and $M(m+2^{K-2})$ stored at an address (t+m) and the corresponding values of the branchmetric.

TABLE 1

| ADDRESS | 8-MSB DATA | 8-LSB DATA |
| --- | --- | --- |
| t + 0 | M(0) | $M(2^{K-2})$ |
| t + 1 | M(1) | $M(1 + 2^{K-2})$ |
| . | . | . |
| t + m | M(m) | $M(m + 2^{K-2})$ |
| . | . | . |
| $t + 2^{K-2} - 1$ | $M(2^{K-2} - 1)$ | $M(2^{K-2} + 2^{K-2} - 1)$ |
| . | . | . |
| t' + 0 | M'(0) | $M'(2^{K-2})$ |
| t' + 1 | M'(1) | $M'(1 + 2^{K-2})$ |
| . | . | . |
| t' + 2m - 1 | M'(2m - 1) | $M'(2m - 1 + 2^{K-2})$ |
| t' + 2m | M'(2m) | $M'(2m + 2^{K-2})$ |
| . | . | . |
| $t' + 2^{K-2} - 1$ | $M'(2^{K-2} - 1)$ | $M'(2^{K-2} + 2^{K-2} - 1)$ |

On the other hand, Table 2 shows a memory map of memory 2 in which values of the branchmetric assumed by the individual paths for given received data are previously calculated and stored.

TABLE 2

| ADDRESS | 8-MSB DATA | 8-LSB DATA |
| --- | --- | --- |
| 0 | A(0) | B(0) |
| 1 | C(1) | D(1) |
| . | . | . |
| 2m | A(2m) | B(2m) |
| 2m + 1 | C(2m + 1) | D(2m + 1) |
| . | . | . |
| $2^{K-1} - 2$ | $A(2^{K-1} - 2)$ | $B(2^{K-1} - 2)$ |
| $2^{K-1} - 1$ | $C(2^{K-1} - 1)$ | $D(2^{K-1} - 1)$ |

In the following, description will be directed to the processing involved in the addition, comparison and the selection for updating the cumulative amount (pathmetric value) of the live paths in the states S(2m) and S(2m+1) through computation at a given time point illustrated in FIG. 2, as well as the operation involved in storing the path select signal by dividing the processing into a first step for addition, comparison and selection of the pathmetric and the branchmetric for the two paths extending toward the state S(2m), a second step for addition, comparison and selection for two paths extending toward the state S(2m+1) and a third step of transferring the pathmetric. The three steps mentioned above are repeatedly executed by updating the value of m one by one.

(1) First step for addition, comparison and selection of the pathmetric and the branchmetric for two paths destined for the state S(2m):

The pathmetric values M(m) and M(m+$2^{K-2}$) in the states S(m) and S(m+$2^{K-2}$) shown in FIG. 2 are read out from an address (t+m) of memory 1 and stored in latch circuit 5 via bus 3, while the branchmetric values A(2m) and B(2m) corresponding to values of the received data are read out from the address 2m of memory 2 and stored in latch circuit 6 via bus 4. The adder 7 adds together the contents of latch circuits 5 and 6 and stores the result in register 11. At that time, the adder 7 performs the addition of "M(m)+A(2m)" on the eight MSBs while performing the addition of "M(m+$2^{K-2}$)+B(2m)" on the eight LSBs. The comparator 8 compares both the value (M(m)+A(2m)) given by the eight MSBs and the value (M(m+$2^{K-2}$)+B(2m)) given by the eight LSBs output from adder 7. When the value of the eight MSBs is less than that of the eight LSBs, comparator 8 outputs a path select signal 9 which assumes the value "0", while outputting a path select signal 9 assuming the value "1" when the value of the eight LSBs is less than that of the eight MSBs. The path select signal 9 is then input to shift register 10 which responds thereto by shifting by one bit.

(2) Second step for addition, comparison and selection for two paths destined toward the state S(2m+1):

Substep (2a): According to the second aspect of the present invention, the pathmetric values M(m) and M(m+$2^{K-2}$) in the states S(m) and S(m+$2^{K-2}$) stored in latch circuit 5 in the first step (1) described above are held by latch circuit 5. (Alternatively, according to the first aspect of the invention, the same pathmetric values M(m) and M(m+$2^{K-2}$) as those mentioned in the first step (1) are once more read out from the address (t+m) of the memory 1.) Further, branchmetric values C(2m+1) and D(2m+1) corresponding to the values of the received data are read out from the address (2m+1) of memory 2 and stored in latch circuit 6 via bus 4. Adder 7 adds together the contents of latch circuits 5 and 6 and stores the result in register 11. In this case, adder 7 performs the addition "M(m)+C(2m+1)" on the eight MSBs while performing the addition "M(m+$2^{K-2}$)+D(2m+1)" on the eight LSBs. The comparator 8 compares the value of the eight MSBs (i.e., M(m)+C(2m+1)) and the value of the eight LSBs (i.e., M(m+$2^{K-2}$)+D(2m+1)) to output a path select signal 9 which assumes the value "0" when the value of the eight MSBs is less than of the eight LSBs, while outputting a path select signal 9 of "1" in the case where the value of the eight LSBs is less than the eight MSBs. The path select signal 9 is then supplied to the shift register 10 which responds thereto by shifting by one bit.

Substep (2b): In the case where the value M'(2m−1) (where 2m−1 is not less than "0" and not greater than "$2^{K-2}$−1") is stored in register 16 at the eight MSBs thereof when the processing in the third step (3) described later on is being executed, the value M'(2m−1) is written in memory 1 at the eight MSBs of the address (t'+2m−1) of memory 1 in response to a MSB write signal 17, whereas when the value M'(2m−1+$2^{K-2}$) (where (2m−1+$2^{K-2}$) is not less than $2^{K-2}$ and not greater than ($2^{K-1}$−1)) has been stored at the eight LSBs of register 16 in the preceding step, the value M'(2m−1+$2^{K-2}$) is written in memory 1 at the eight LSBs of the address (t'+2m−1) in response to a LSB write signal 18.

Substep (2c): Further, when the value of the path select signal 9 resulting from the aforementioned step (1) is "0", the value M(m)+A(2m) written in register 11 at the eight MSBs in the aforementioned step (1) is stored in register 16 via distributor 12 and bus 15, whereas when the value of the path select signal 9 is "1", the value M(m+$2^{K-2}$)+B(2m) of the eight LSBs written in the step (1) is stored in register 16 via distributor 13 and bus 15. In that case, when m is not greater than ($2^{K-2}$−1), the updated pathmetric value M'(2m) is stored in register 16 at the eight MSBs thereof via the eight MSB lines of bus 15 under the command of the MSB/LSB select signal 14. On the other hand, when m is not less than $2^{K-2}$, the updated pathmetric value M'(2m+$2^{K-2}$) is stored in register 16 at the eight LSBs via the eight LSB lines of bus 15 in response to the MSB/LSB select signal 14.

(3) Cumulative value transfer step

Substep (3a): In the case where the value M'(2m) (where 2m is not less than "0" and not greater than $2^{K-2}$−1) has been stored in register 16 at the eight MSBs thereof, the value M'(2m) is written in memory 1 at the eight MSBs of the address (t'+2m). On the other hand, when the value M'(2m+$2^{K-2}$) (where 2m is not less than "0" and not greater than ($2^{K-2}$−1)) is stored in register 16 at the eight LSBs in the step (2) described above, the value M'(2m+$2^{K-2}$) is written in memory 1 at the eight LSBs of the address (t'+2m) in response to the LSB write signal 18.

Substep (3b): Further, when the value of the path select signal 9 output in the aforementioned step (2) is "0", the value M(m)+C(2m+1) of the eight MSBs written in register 11 at the eight MSBs in the step (2) is stored in register 16 via distributor 12 and bus 15, while when the value of the path select signal 9 is "1", the value M(m+$2^{K-2}$)+D(2m+1) of the eight LSBs is stored in register 16 via distributor 13 and bus 15. In that case, when m is not greater than ($2^{K-2}$−1), the updated pathmetric value M'(2m) is stored in register 16 at the eight MSBs via the eight MSB lines of bus 15 under the command of the MSB/LSB select signal 14. On the other hand, when m is not less than $2^{K-2}$, the updated pathmetric value M'(2m+$2^{K-2}$) is stored in register 16 at the eight LSBs via the eight LSB lines of bus 15 in response to the MSB/LSB select signal 14.

As will be appreciated from the foregoing description, the arithmetic operations including the addition, comparison and the selection are effected twice each through six steps, in the case of the processing known heretofore, can be executed through three steps according to the invention in the illustrated embodiment. By executing the processing in the step 3a once after repeating execution of the third step a number of times corresponding to $2^{K-2}$ times while incrementing the value of m from "0" one by one, the pathmetric of the live paths (i.e., the paths remaining alive) in the $2^{K-1}$ states at a given time point can be calculated and updated. Further, by storing the value of shift register 10 in memory 1 via bus 15 every time the third step mentioned above is executed (executed repeatedly eight times), the path select signal 9 at any given time point and in any state can be stored with the required memory resource being reduced to a minimum.

As is apparent from the foregoing description, memory 1 stores a set of pathmetric values of the live paths in the states S(m) and $S(m+2^{K-2})$ at every time point in one word, while memory 2 stores in one word a set of branchmetric values assumed by two paths, i.e., the path which transits from the state S(m) to the state S(2m) and the path which transits from the state $S(m+2^{K-2})$ to the state S(2m) upon previously storing the branchmetric values which the paths can assume for the values of the received data. The pathmetric value and the branchmetric value for the two paths as read out simultaneously from memories 1 and 2 are simultaneously added by adder 7 at the MSBs and the LSBs, respectively, and comparator 8 compares the values of the MSBs and the LSBs output from the adder 7 to thereby decide which of the paths has the lesser pathmetric value and outputs the path select signal 9 on the basis of the result of the above decision. Shift register 10 stores the path select signal 9 on a bit-by-bit basis. Of the MSB value and the LSB value in register 11 which stores the output of adder 7, the value decided to be lesser by the path select signal 9 is written in memory 1 at eight MSBs or LSBs via distributor 12 or 13, bus 15 and register 16. In this manner, updating of the cumulative amount (pathmetric value) of the live path in the Viterbi decoding as well as storing of the path select signal a through the addition, comparison and the selection can be realized in a number of processing steps which is reduced to about one-fourth when compared with the known technique. Besides, the path select signal of one bit which has been stored in one word of the memory in the case of the known technique can be stored in a memory word which is smaller than the case of the known technique by one sixteenth according to the invention by virtue of such arrangement that the select signal is once stored in shift register 10 and when the bit number of the select signal has attained sixteen, the select signal is stored in the memory. Besides, because the updated pathmetric value is written only at either one of the eight MSBs or LSBs of the memory 1, it is possible to store the pathmetric value with a number of memory words which is decreased by a factor of ½ when compared with the case of the known technique.

Additionally, because the pathmetric values M(m) and $M(m+2^{K-2})$ in the states S(m) and $S(m+2^{K-2})$ stored previously in latch circuit 5 in step (1) are held by latch circuit 5 and output to adder 7 in the aforementioned step (2), it becomes unnecessary in step (2) to read out once again from memory 1 the same pathmetric value M(m) and $M(m+2^{K-2})$ as those in step (1). Thus, it is sufficient to execute the access to memory 1 only once in each of the three steps mentioned above. In other words, the number of the memory accesses as involved in the processing can be diminished to a necessary minimum, whereby the Viterbi decoding can be accomplished without being accompanied with any appreciable power consumption.

It should further be mentioned that adder 7, register 11 and the latch circuits 5 and 6, which are constituents of the apparatus according to the instant embodiment, are generally the parts which already exist for the arithmetic operation in digital signal processors or the like, which means that the arithmetic apparatus can be implemented with addition of only a small number of hardware such as comparator 8 and shift register 10, to another advantage.

Next, description will be made of a second embodiment of the present invention by reference to the drawings.

Figure 4:
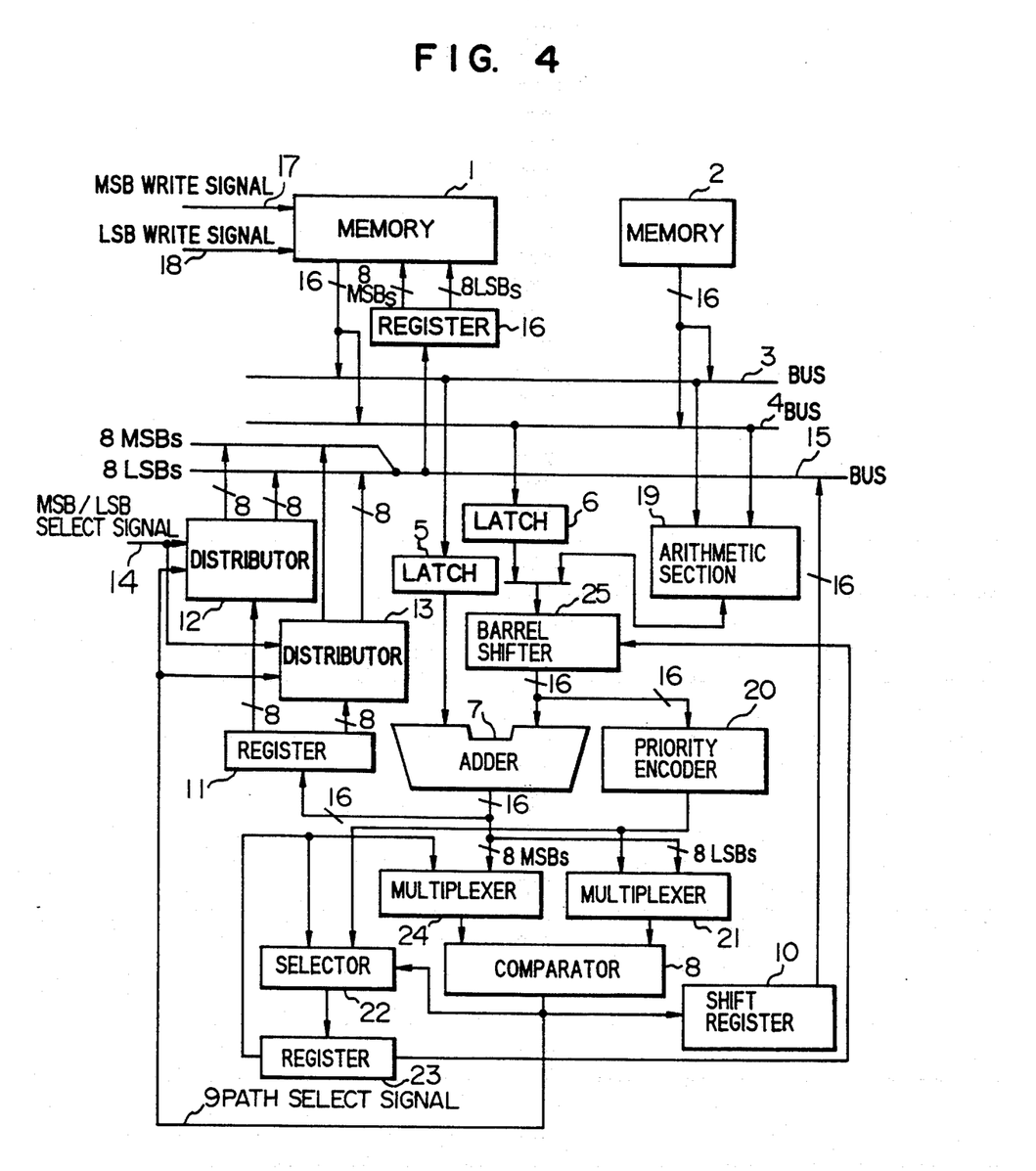
FIG. 4 is a schematic block diagram showing a configuration of an arithmetic apparatus according to a second embodiment of the invention.

FIG. 4 shows a schematic block diagram of an arithmetic apparatus according to the second embodiment of the invention.

Referring to FIG. 4, numerals 1 to 18 denote components which are the same as or equivalent to those designated by like reference numerals in FIG. 1. Accordingly, repeated description of these numerals will be unnecessary. Further, reference numeral 19 denotes an arithmetic section for performing arithmetic operations on the data read out from memory 1 and the data read out from memory 2, numeral 20 denotes a priority encoder for detecting a number of shifts to the left (left shifts) as required for normalizing the output of arithmetic section 19. Numeral 21 denotes a multiplexer for selecting one of the output from priority encoder 20 or the eight LSBs output from adder 7 for supplying the selected output data to comparator 8, numeral 22 denotes a selector for selecting in accordance with the path select signal 9 one of the output from priority encoder 20 or the output of a register 23 which is adapted to store the output of the selector 22. Numeral 24 denotes a multiplexer for selecting one of the output of the register 23 or the eight MSBs output from the adder 7. Numeral 25 denotes a barrel shifter for shifting the data read out from memory 1 via bus 4 in accordance with the number of shifts as output from register 23.

With the arithmetic apparatus of the structure described above, a block floating-point arithmetic operation can be performed at high speed, in addition to the Viterbi decoding processing described above in conjunction with the first embodiment. Description concerning the Viterbi decoding processing is omitted because it can be carried out in utterly the same manner as in the case of the first embodiment. The following description will therefore be directed to only the process involved in the block floating-point arithmetic operation.

In many of the DSPs, a number system based on a fixed-point representation system is adopted in view of an advantage that a high-speed operation is possible. However, this system also suffers a drawback that there always exists possibility of size error and cancellation when arithmetic operation is executed repetitively.

A method for eliminating the drawback mentioned above is based on a numerical value representation system referred to as a block floating-point representation system in which a representation scheme is adopted that one exponent or scale factor is imparted to a plurality of data which is to be processed. In other words, the cancellation is prevented by applying a same scaling to a plurality of data. In principle, data are left-justified for the purpose of preventing the occurrence of cancellation during multiplication. At this juncture, it can be understood that in order to apply the same scaling to the plurality of data, it is necessary to determine the number of left-shifts (i.e., number of shifts to the left) which is required for standardizing the individual data, respectively, and then select the minimum left-shift number for shifting all the data to the left for the standardization.

Now, a method of carrying out the block floating-point processing mentioned above will be described in conjunction with the second embodiment of the invention on the assumption that the number system is a 16-bit radical-2 complement system, the most significant bit is a sign bit and that the decimal point is located at the right side to the most significant bit.

Referring to FIG. 4, a series of results of arithmetic operations which are output from arithmetic section 19 and which are not always normalized are stored in memory 1 by way of barrel shifter 25, adder 7, register 11, bus 15 and so forth and at the same time undergo the block floating-point arithmetic processing in the manners described below.

(1) In the first place, when a value whose least significant bit is "1" the with other bits being "0s", respectively, is inputted to the priority encoder 20, the left shift number of "14" required for the normalization is output. This value is stored as the initial value in register 23 via the selector 22.

(2) Subsequently, the value output from arithmetic section 19 is caused to pass through barrel shifter 25 intact and adder 7 to be stored in register 11. At the same time, the same value is input to priority encoder 20 which then computes the number of left shifts required for the normalization and outputs the result of computation to multiplexer 21 and selector 22. Multiplexer 21 selects the output of priority encoder 20, the multiplexer 24 selects the output of register 23. The comparator 8 compares magnitudes of the output of multiplexer 21 with that of multiplexer 24 to output the select signal to selector 22. According to the basis of the select signal output from comparator 8, selector 22 newly stores in register 23 either the content of register 23 or the output of priority encoder 20 whichever is smaller. Further, the output value of arithmetic section 19 as stored in register 11 is stored in the memory 1 via bus 15. At this time point, the distributors 12 and 13 output the eight MSBs of register 11 onto the eight MSB lines of bus 15 while outputting the eight LSBs onto the eight LSB lines of bus 15, respectively.

(3) Every time the arithmetic section 19 outputs new result of arithmetic operation, the operations described in the above-mentioned step (2) are repetitively executed, whereby the minimum bit number for the left-shift as required for the normalization of the results of arithmetic operations can be determined and held by register 23.

(4) Next, a series of results of arithmetic operations stored in memory 1 are sequentially read out for the normalization and transferred to barrel shifter 25 via bus 4 and latch circuit 6. The barrel shifter 25 performs the shifting in accordance with the shift number indicated by register 23, the result of which is stored in memory 1 via register 11, bus 15 and the register 16 after having passed through the adder 7 intact.

As will be appreciated from the above description, with the arrangement according to the instant embodiment in which simultaneously with storing of the output of the arithmetic section 19 the memory 1, priority encoder 20 detects the number of the left shifts required for normalization of the result of operation of the arithmetic section 19 and outputs the detected shift number to comparator 8 which then compares the output of priority encoder 20 with that of register 23 and outputs the result of comparison to selector 22. Selector 22 then selects the lesser one of the output of priority encoder 20 or that of register 23 with the selected value being newly stored in register 23. It is possible to determine the minimum number of bits for the left shift as required for normalization of the results of the series of arithmetic operations as the block data simultaneously with the storage of the series of operation results output from arithmetic section 19. Thus, the block floating-point arithmetic can be realized at high speed. Further, since comparator 8 can be utilized for both executions of the Viterbi decoding and the block floating-point arithmetic processing, costs involved in implementation can be reduced.

In the case of the embodiments described above, both distributors 12 and 13 are disposed between register 11 and bus 15. It should be understood that they may be interposed between bus 15 and register 16 essentially to the same effect. It should further be mentioned that the bit widths of memories 1 and 2, adder 7, shift register 10, comparator 8 and other components may be set appropriately to conform with the constraint length of the convolutional code to be decoded, the encoding rate and the number of received data to be decoded. By way of example, when the encoding rate is ½, the bit number of the received data is "2". Since the Hamming distance between two bits is "0", "1" or "2", the branchmetric values A, B, C and D stored in memory 2 can be represented by two bits, as is shown in Table 2. Thus, memory 2 can be connected to the bus of 4-bit width, wherein bits "0" and "1" of the two LSBs are connected to bits "0" and "1", respectively, of bus 4, while bits "2" and "3" of the two MSBs may be connected to bits "8" and "9", respectively, of bus 4. Further, in the case where the number of received data to be decoded at the rate of ½ is not greater than "63", the pathmetric value (cumulative value) can not exceed "126 (=2×63)". Thus, the bit width of memory 1 for storing the pathmetric value may be set to 14 bits with adder 7, bus 3 register 11 and other components being equally set to 14-bit width.

In the case of the second embodiment of the invention, the output of arithmetic section 19 is caused to pass through barrel shifter 25 intact for storage in memory 1 via barrel shifter 25, adder 7 and other components. However, in the case where the size error or cancellation is expected in the output of arithmetic section 19, such arrangement may be adopted in which the number of shifts for barrel shifter 25 can be set arbitrarily to thereby shift the output of arithmetic section 19 for preventing the occurrence of a size error and/or cancellation, whereon loading in memory 1 and detection of the shift number required for the normalization by priority encoder 20 may be effected. Finally, it should be appreciated that numerous modifications and variations of the illustrated embodiments may easily be resorted to without departing from the spirit and scope of the invention.

As is apparent from the foregoing description, in the arithmetic processing apparatus according to the first aspect of the present invention, in which addition of the n most significant bits and addition of the n least significant bits of data stored in the first and second memories, respectively, are simultaneously effected by the adder, while the comparator compares the value of the n most significant bits and that of the n least significant bits as output from the adder to thereby write the result of the addition for the n most significant bits or n least significant bits whichever is decided to be the lesser amount by the comparator in either the n most significant bits or n least significant bits of the first memory by the write means, to thereby allow the shift register to store sequentially the select signals output from the comparator. It is possible to perform the addition, comparison and the selecting arithmetic for determining the cumulative value (pathmetric) of the live paths in the Viterbi decoding as well as the storage of the path select signals with a decreased number of processing steps and a small memory overhead. Thus, the Viterbi decoding processing can be executed at an increased speed while reducing hardware cost.

In the arithmetic apparatus according to the second aspect of the invention in which the data read out from the first memory is temporarily stored in the storage means and at the same time output to the adder for allowing the adder to perform the first addition, while the second addition is performed on the data which has been stored in the storage means as the source data for the first addition, it is possible to decrease the number of times the memory access is required, which in turn means that the Viterbi decoding can be carried out with a reduced number of processing steps, assuring thus realization with low power consumption.

Further, with the arrangement of the arithmetic apparatus according to the third aspect of the invention in which simultaneously with the storage of the output of the arithmetic section in the first memory, the priority encoder detects the number of left-shifts required for normalizing the results of operation performed by the arithmetic section and outputs the left-shift number as determined to the comparator which compares the output of the priority encoder with that of a third register, the result of the comparison being transferred to the selector, wherein the selector selects a smaller value of the output of the priority encoder or the output of the third register to thereby store the selected value in the third register, it is possible to determine the minimum left-shift number required for standardizing the results of operations performed sequentially by the arithmetic section simultaneously with the storage of the results of sequential operations outputted successively from the arithmetic section, whereby the block floating-point arithmetic processing can be carried out at a high speed.

What is claimed is:

1. An arithmetic apparatus, comprising:
a first memory, having a bit width of not less than 2n bits where n is a positive integer, for storing at least first data having a bit width of n bits into an upper half of the bit width of the first memory and second data having a bit width of n bits into a lower half of the bit width of the first memory;
a second memory, having a bit width of not less than 2n bits, for storing at least third data having a bit width of n bits into an upper half of the bit width of the second memory and fourth data having a bit width of n bits into a lower half of the bit width of the second memory;
an adder, having a bit width of not less than 2n bits, for adding the first data and the third data at an upper half of the bit width of the adder in parallel with adding the second data and the fourth data at a lower half of the bit width of the adder and outputting an added data having a bit width of at least 2n bits;
a comparator for comparing a first value represented by an upper half of the bit width of the added data and a second value represented by a lower half of the bit width of the added data, and outputting a select control signal indicating which of the first and second values is a smaller value;
first register means for temporarily storing the select control signal;
second register means for temporarily storing the first and second values represented by the upper and lower halves of the bit width of the added data, respectively; and
write means for writing into the first memory the smaller value of the first and second values stored in the second register means based on the select control signal stored in the first register means.

2. An arithmetic apparatus according to claim 1, wherein the write means includes means for selecting one of the upper half and the lower half of the bit width of the first memory for writing the smaller value of the first and second values.

3. An arithmetic apparatus according to claim 1, further comprising:
store means for temporarily storing data output from the first memory and for outputting the temporarily stored data to the adder.

4. An arithmetic apparatus according to claim 1, further comprising:
arithmetic means for performing arithmetic operations on at least two of the first, second, third and fourth data stored in the first and second memories;
arithmetic result write means for writing output data of the arithmetic means into the first memory;
a priority encoder for detecting a number of left shifts required for normalization of the output data of the arithmetic means;
a first multiplexer for selecting one of an output data of the priority encoder and the lower half of the bit width of the added data, and outputting the selected one of the output data of the priority encoder and the lower half of the bit width of the added data to the comparator;
a selector for selecting one of the output data of the priority encoder and an output data of a third register means based on the select control signal, the third register means storing output data of the selector;
a second multiplexer for selecting one of the output data of the third register means and the upper half of the bit width of the added data and supplying the selected one of the output data of the third register means and the upper half of the bit width of the added data to the comparator; and
a barrel shifter for shifting at least one of the first and second data output from the first memory in accordance with a number of left shifts output from the third register means.

5. An arithmetic apparatus, comprising:

an adder, having a bit width of not less than 2n bits where n is a positive integer, for receiving at least first, second, third and fourth data, each of the first, second, third and fourth data having a bit width of n bits, the adder adding the first data and the third data at an upper half of the bit width of the adder in parallel with adding the second data and the fourth data at a lower half of the bit width of the adder and outputting an added data having a bit width of at least 2n bits;

a comparator for comparing a first value represented by an upper half of the bit width of the added data and a second value represented by a lower half of the bit width of the added data and outputting a select control signal indicating which of the first and second values is a smaller value; and selecting means for selecting one of the first and second values based on the select control signal.

* * * * *